US012755078B1

(12) United States Patent
Deaton

(10) Patent No.: US 12,755,078 B1
(45) Date of Patent: Oct. 6, 2026

(54) HELPER ASSERTION GUIDANCE FOR CIRCUIT DESIGN VERIFICATION

(71) Applicant: Cadence Design Systems, Inc., San Jose, CA (US)

(72) Inventor: Craig Franklin Deaton, Rowlett, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 848 days.

(21) Appl. No.: 18/133,405

(22) Filed: Apr. 11, 2023

(51) Int. Cl.
*G06F 30/367* (2020.01)

(52) U.S. Cl.
CPC .................................. *G06F 30/367* (2020.01)

(58) Field of Classification Search
CPC ..................................................... G06F 30/367
See application file for complete search history.

(56) References Cited

U.S. PATENT DOCUMENTS

| | | | | |
|---|---|---|---|---|
| 8,990,745 | B1 * | 3/2015 | Coelho | G06F 30/20 716/111 |
| 9,817,930 | B1 * | 11/2017 | Campos | G06F 30/18 |
| 10,635,768 | B1 * | 4/2020 | Roque | G06F 30/33 |
| 2015/0242541 | A1 * | 8/2015 | Cerny | G06F 30/3323 716/106 |

OTHER PUBLICATIONS

Korchemny, Dmitry, "Systemverilog Assertions for Formal Verification", HVC, (Nov. 4, 2013), 118 pgs.

* cited by examiner

*Primary Examiner* — Chuen-Meei Gan
(74) *Attorney, Agent, or Firm* — Schwegman Lundberg & Woessner, P.A.

(57) ABSTRACT

Various embodiments provide for determining guidance that assist in determining one or more helper assertions for circuit design verification, which used as part of an electronic design automation (EDA) software.

20 Claims, 11 Drawing Sheets

HELPER ASSERTION GUIDANCE FOR CIRCUIT DESIGN VERIFICATION

TECHNICAL FIELD

Embodiments described herein relate to circuit design and, more particularly, to systems, methods, devices, and instructions for determining (e.g., generating) guidance that assists in determining one or more helper assertions for circuit design verification, which is used as part of an electronic design automation (EDA) software.

BACKGROUND

Electronic design automation (EDA) software systems usually enable analysis and debugging of a circuit design (e.g., integrated circuit (IC) design) to determine correctness of the circuit design. The analysis and debugging techniques currently used include logic gate-level simulation, Register Transfer Language (RTL)-level simulation, and formal verification.

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
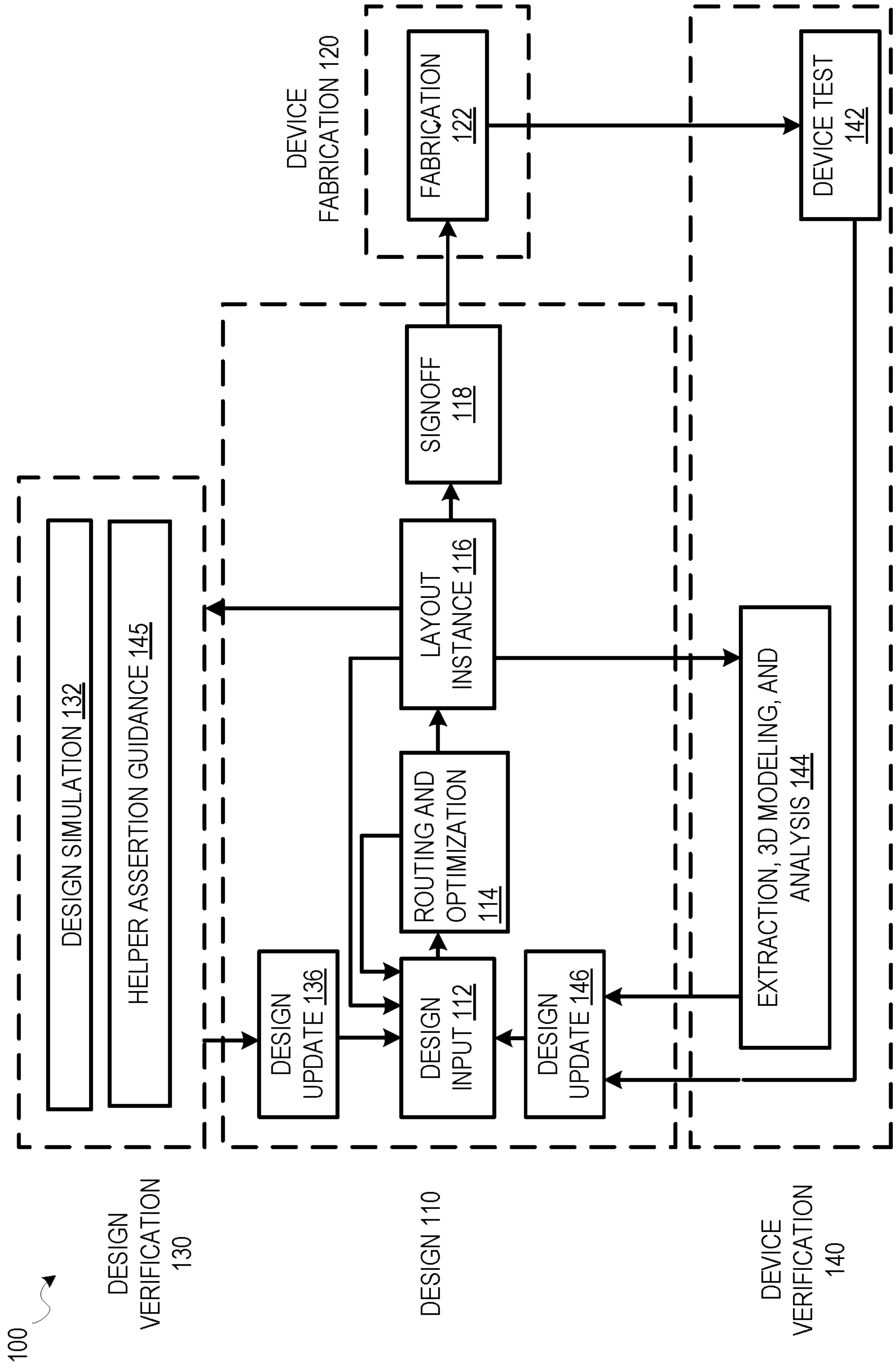
FIG. 1 is a diagram illustrating an example design process flow for determining guidance that assists in determining one or more helper assertions for circuit design verification, according to some embodiments.

Specifications or requirements for a circuit design can specify one or more design properties that the circuit design is expected to satisfy to be considered correct, and such specification/requirements can be expressed in a formal notation (such as Property Specification Language (PSL) or System Verilog Assertions [SVA]) that enables a tool to perform an exhaustive check of whether a circuit design complies with its specification/requirements. Traditionally, simulation and formal verification provide two different techniques for verifying correctness of a circuit design based on a specification or requirements.

Simulations, such as a RTL-level simulation, can simulate operation of a circuit design based on one or more environmental conditions and, during simulation, generate one or more parameter values (such as values of signals) of the circuit design across time steps (e.g., measured in cycles). As used herein, a parameter value of a circuit design can include without limitation a value of a signal (also referred to herein as a signal value) of the circuit design. A trace can comprise a collection of one or more parameter values (e.g., certain specified parameter values, such as signal values) of a circuit design generated across time steps (e.g., a sequence of values for one or more signals) during a simulation run or testing of the circuit design (e.g., simulating operation of the circuit design using different possibility of stimuli, such as input signals), which can be used to verify the correctness of the circuit design (e.g., by using the trace to prove an assertion with respect to the circuit design). A given trace can be associated with (e.g., collect parameter values related to) a particular behavior or design property of a circuit design.

Formal verification on the other hand verifies one or more design properties of a circuit design by proving that a design property is either always true or by providing an example condition (e.g., a counterexample) that demonstrates the property is false. This formal verification process (also referred to as formal verification) can comprise determining (e.g., generating) an assertion that mathematically explores the state space of a circuit design until it finds a counterexample (e.g., determine stimulus to the circuit design that breaks an assertion) or determines a proof (e.g., proof that for the circuit design, the assertion always holds true regardless of stimulus). As used herein, an assertion can describe (e.g., in formal notation) a specific (e.g., desired) behavior by a circuit design (e.g., a design property of the circuit design) that can be observed at one or more points of the circuit design, and the assertion can comprise a conditional statement (e.g., that indicates a pass or fail) that checks for the specific behavior at those points. For instance, an assertion can be observed by way of one or more parameter values of a given trace, and a condition of the assertion (that is checking a specific behavior of the circuit design) can be checked based on the one or more collected parameter values. Generally, an assert type of assertion (or assert property) can check that a design property of a circuit design always holds true (and should never be violated by the circuit design), and if the design property is violated, a failure (e.g., of the design property) would be asserted. An assert trace of a circuit design can comprise a trace that at least attempts to prove that an assertion always holds true for the circuit design. In comparison, a cover property (or cover) can be a design property of a circuit design that should be satisfied or met by the circuit design. A cover trace of a circuit design can comprise a trace that at least attempts to prove a cover passes or holds true at least once (e.g., at least one time cycle) for the circuit design. A tool that uses formal verification to check an assertion with respect to a circuit design is often referred to as a model checker. A cover is usually used as a test goal, and describes a condition (e.g., a circuit design behavior) that should be met for a verification process to be considered complete. Unlike a simulation, which checks a design property by exploring a state space of a circuit design at a subset of points of the circuit design (e.g., a subset because exploring all possibilities of all stimuli is too large), formal verification can prove that a design property holds for all points of a state space of a circuit design.

Traditionally, formal verification uses temporal induction as a common engine heuristic for determining (e.g., generating) a proof with respect to a given assertion. With temporal induction, an assertion (e.g., a condition of the assertion) being proven to hold is assumed to hold for N cycles from a non-reset state (e.g., at cycle one of any trace, the circuit design could be in any state in the state space, regardless of whether the state is reachable from reset or not) of a circuit design, and checked to see that the assertion always holds in cycle N+1. If the assertion is shown to always hold in cycle N+1, then the assertion is checked to see if it holds for N cycles starting from a reset state of the circuit design. If this is also shown to be true, then the assertion is proven to hold, starting from reset, for all time.

Unfortunately, temporal induction does not always work. Specifically, the challenge is that there are usually states that are not reachable from reset from which the "does the assertion hold in cycle N+1" check fails (resulting in a failing trace). To address this challenge and attain an overall proof, such unreachable-from-reset states can be characterized and, based on the characterization, it can be proven that they cannot happen. This traditionally involves presenting the failing trace to a user (e.g., circuit design verification engineer) and asking them to manually analyze it. The result of this analysis can be helper assertions (e.g., lemmas) that help rule out the unreachable-from-reset states, which can eat up temporal induction processing time. However, manually analyzing and determining helper assertions without guidance can be challenging for a user because the "characteristic" being searched for is often obscure and non-obvious.

Various embodiments described herein address these and other deficiencies of the conventional technologies. In particular, various embodiments provide for systems, methods, devices, and instructions that determine (e.g., generate) guidance for determining (e.g., generating) one or more helper assertions for unreachable states of a circuit design. Some embodiments generate a first trace (e.g., a witness trace) that shows the assertion passing, iteratively constrain and re-generate a second trace (e.g., original trace) to make it as similar (e.g., maximally similar) to the first trace as possible, and thereafter highlight relevant activity (e.g., differences) in both the first trace and the second trace. For instance, after iteratively constraining and re-performing the second trace, the results of the first trace and the second trace can be shown side-by-side with the relevant portions highlighted. For some embodiments, the relevant activity is highlighted such that the highlighting shows the relevant parameter values (e.g., relevant signal values) that are different in the two traces. Based on the highlighting, a user can easily identify and focus on one or more relevant parameter values and determine one or more helper assertions based on those relevant parameter values, where the determined helper assertions can be used with the second trace to assist the second trace in converging with the first trace, thereby getting the second trace to pass the assertion.

Though various embodiments are described herein with respect to providing (e.g., generating) one or more highlights as guidance for determining one or more helper assertions for an original assertion, various embodiments can provide guidance by other means (e.g., other visual forms), such as text, graphics, formatting, size, color, and animation, which can be presented with respect to (e.g., visual representation of) one or more traces (e.g., original trace and witness trace).

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for determining guidance that assists in determining one or more helper assertions for circuit design verification, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. The routing and optimization 114 operation may also include other operations not shown, such as those relating to floor planning, placement, post-placement optimization, and post-routing optimization.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design; after routing, during register transfer level (RTL) operations; or as part of a signoff 118, as described below.

Design inputs are used in the design input 112 operation to generate an initial circuit layout. The design inputs may be further processed during the design input 112 operation via a process, such as logic-synthesis, to generate a circuit netlist mapped to a target standard library manufacturable by the foundry in a fabrication 122 operation. After design inputs are used in the design input 112 operation to generate an initial circuit layout, and any of the routing and optimization 114 operations are performed, a resulting layout is generated as the layout instance 116. The netlist, as placed by the layout instance 116, describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations and layout modifications generated based on actual device performance. In addition to the design simulation 132 operation, the design verification phase 130 can include a helper assertion guidance 145 operation, which may be performed in accordance with various embodiments to determine one guidance that assists in determining one or more helper assertions for circuit design verification. For some embodiments, at least some portion of the helper assertion guidance 145 operation can be performed as part of a verification process being performed on a circuit design. As described in more detail below, a design update 136 based on the design verification phase 130, a design update 146 from the device test 142 operations or the extraction, 3D modeling, and analysis 144 operations, or the design input 112 operation may occur after the initial layout instance 116 is generated. In various embodiments, whenever design inputs are used to update or change an aspect of a circuit design, a timing analysis and the routing and optimization 114 operation may be performed.

Figure 2:
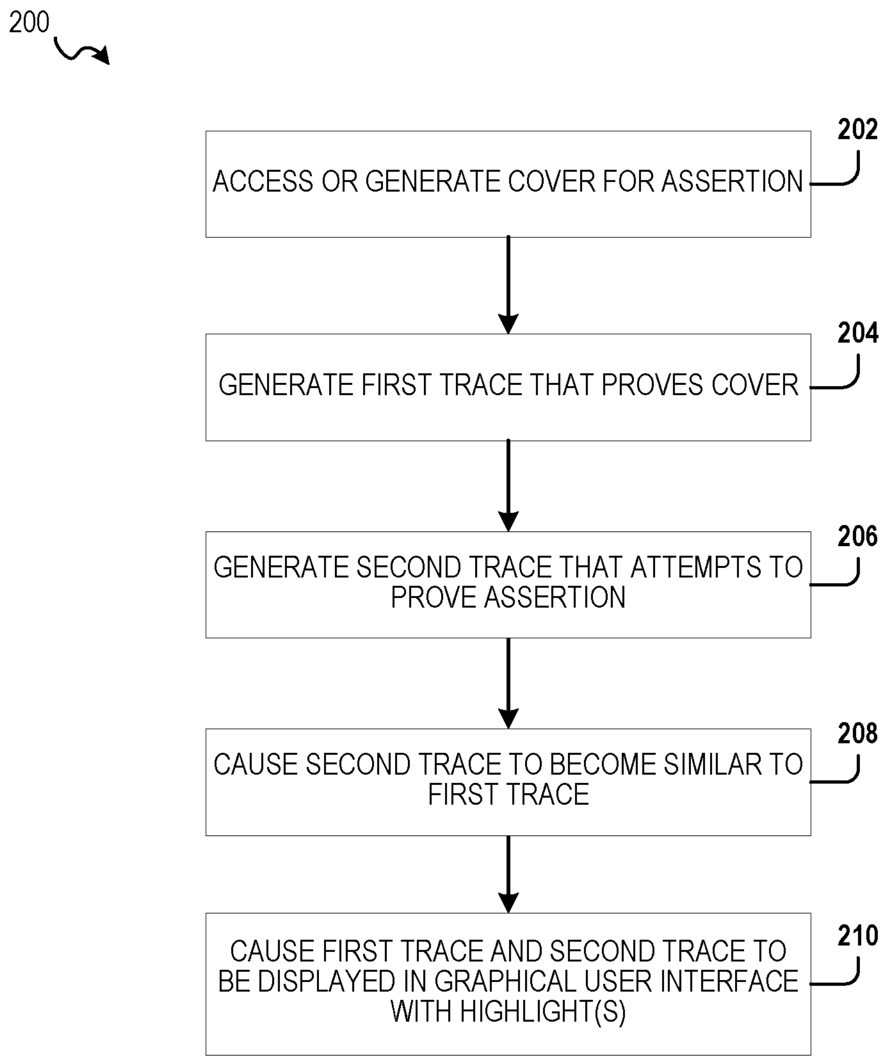
FIGS. 2 through 4 are flowcharts illustrating example methods for determining guidance that assists in determining one or more helper assertions for circuit design verification, according to some embodiments.
Figure 3:
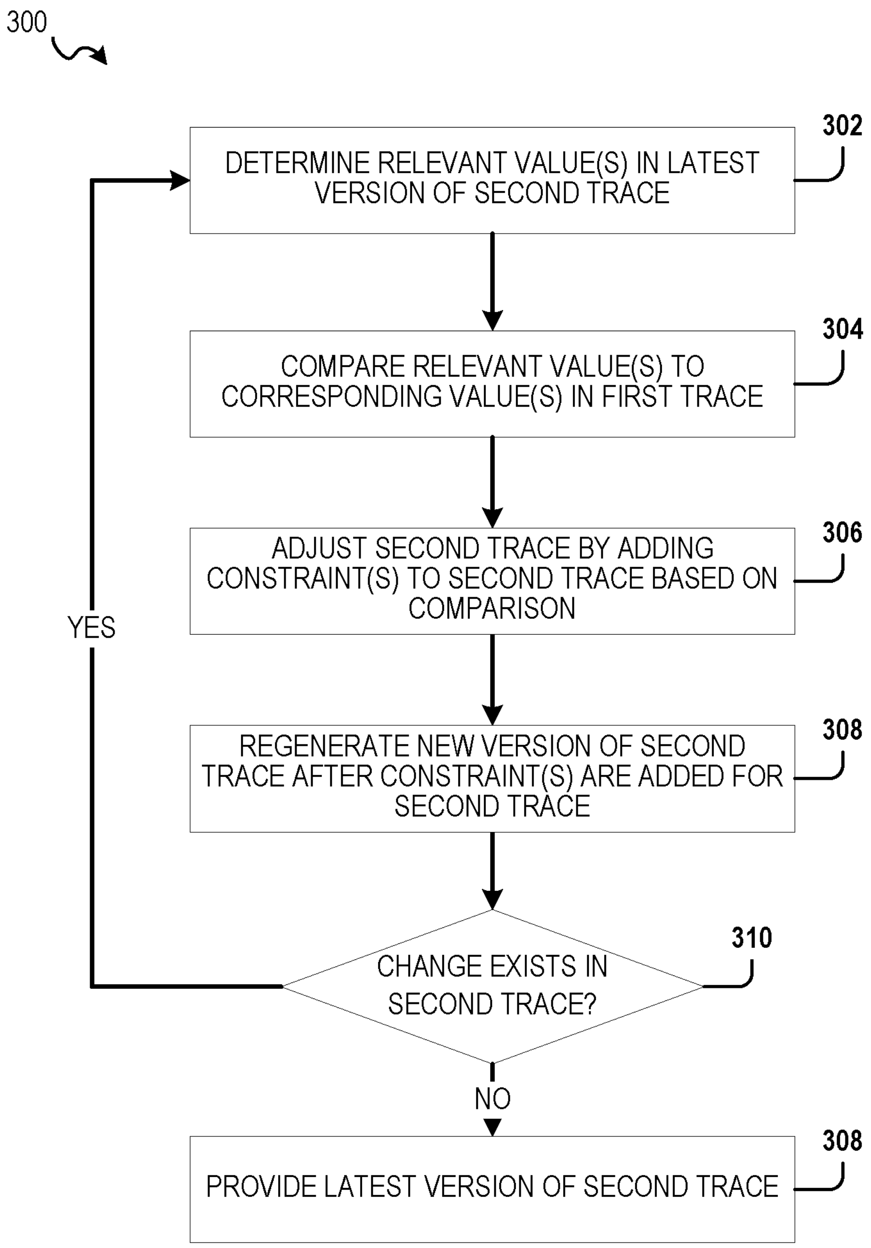
Figure 4:
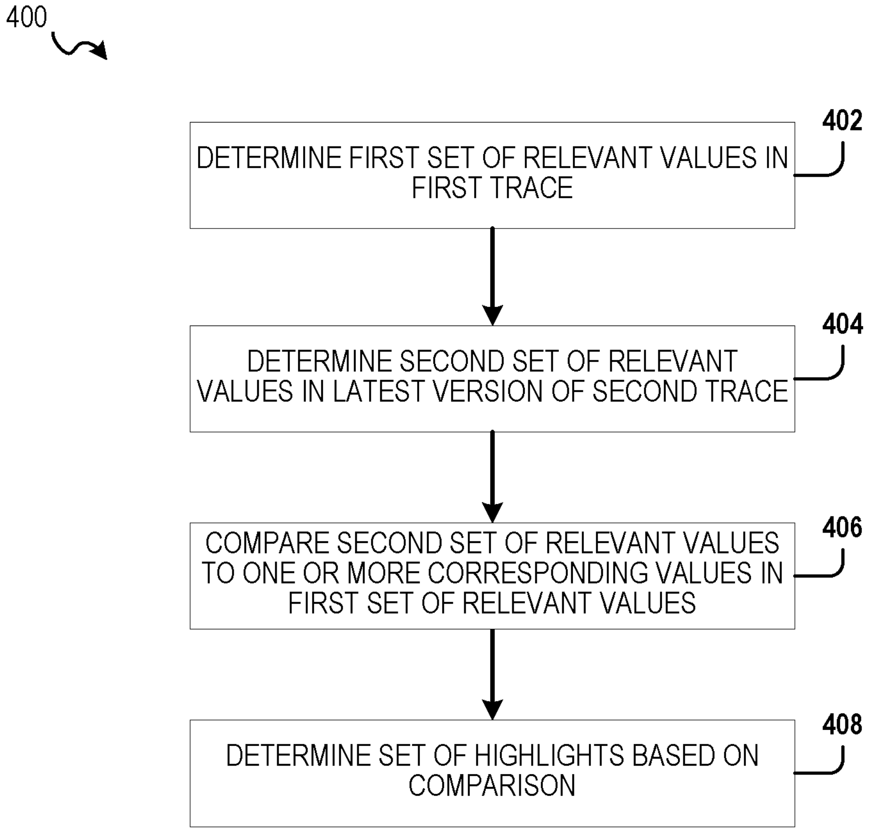

FIGS. 2 through 4 are flowcharts illustrating example methods for determining guidance that assist in determining one or more helper assertions for circuit design verification, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

For some embodiments, one or more operations of the method 200 are performed during a verification process performed on a circuit design (e.g., by an EDA software system). An operation of the method 200 (or another method described herein) may be performed by a hardware processor (e.g., central processing unit or graphics processing unit) of a computing device (e.g., desktop, server, etc.).

As illustrated, at operation 202, a cover (or data describing a cover) for an assertion of a circuit design is accessed. For some embodiments, the assertion describes a design property of the circuit design, and the cover is configured to show (e.g., cause a verification process to show) that the assertion holds true at least once (e.g., at least for one cycle) for the circuit design. The cover can be regarded as the witness cover. Depending on the embodiment, the cover accessed by operation 202 can be automatically determined (e.g., generated) by a process in view of the assertion, or the cover can be manually determined (e.g., generated) by a user (e.g., circuit design verification engineer). For instance, the cover can be determined (e.g., generated) based on at least one condition for the circuit design recited by the assertion. The following is an example of assertion (e.g., assert type of assertion) defined in System Verilog.

```
property valid 2cycle;
@(posedge clk) (eg_odd==1'b0)|->(eq_valid==1'b1)
end property;
a_wvalid_2cycle: assert property (wvalid_2cycle);
```

For the foregoing example assertion, a related example cover can be determined to comprise the following (e.g., by converting the implication operator '|->' of assertion's condition to a logical AND operator '&').

```
(eg_odd==1'b0) & (eq_valid==1'b1)
```

During operation 204, a first trace is generated that proves the cover for the circuit design starting from a reset state of the circuit design. Accordingly, for some embodiments, the first trace is regarded as a cover trace and can be further regarded as a witness trace. Additionally, operation 206 generates a second trace (e.g., original trace) that at least attempts to prove that the assertion always holds true for circuit design starting from a non-reset state of the circuit design.

Thereafter, operation 208 causes the second trace to become similar (e.g., as similar as possible, or maximally similar) to the first trace by iteratively adjusting and regenerating the second trace. For some embodiments, operation 208 comprises performing one or more process iterations, where each process iteration can comprise determining a set of relevant values in a latest version of the second trace. Each process iteration can comprise comparing the set of relevant values to a set of corresponding values in the first trace. Each process iteration can comprise adjusting the second trace by adding a set of constraints for the second trace based on the comparing of the set of relevant values and the set of corresponding values. Each process iteration can comprise regenerating a new version of the second trace after the set of constraints are added for the second trace (e.g., set of constraints added for generating the second trace). For example, adding the set of constraints for the second trace can comprise determining whether a relevant value from the set of relevant values agrees with a corresponding value from the set of corresponding values and, in response to determining that the relevant value agrees with the corresponding value, adding a constraint for the second trace that maintains agreement between the relevant value and the corresponding value. Alternatively, in response to determining that the relevant value disagrees with the corresponding value, a constraint can be added for the second trace that causes agreement between the relevant value and the corresponding value (e.g., causes the disagreement to be converted to an agreement).

Each process iteration can comprise determining whether a change exists between the latest version of the second trace and the new version of the second trace and, in response to the determining that the change exists, re-performing the process iteration (e.g., performing the process iteration again) but with the new version of the second trace as the latest version of the second trace. Alternatively, in response to determining that a change does not exist, the process iteration can end and the latest version of the second trace can be provided for further processing (e.g., for display to a user through a graphical user interface [GUI]).

Depending on the embodiment, a given process iteration ends after one or more conditions are met. For instance, a condition can be based on a number of times process iterations has been performed, how long the operation 208 has been operating, how similar the latest version of the second trace is to the first trace, or determining that the second trace is not getting more similar to the first trace after performing the process iteration a certain number of consecutive times (e.g., no improvement between the latest version of the second trace and a new version of the second trace). For instance, operation 208 can perform and re-perform the process iteration until a similarity condition is met (e.g., no change in the second trace between consecutive performances of the process iteration), or until the process iterations has been a max number of times. As another example, a condition can be based on how much time has elapsed (e.g., the process iteration ends after a certain amount of time has elapsed). An example of operation 208 is illustrated and described with respect to method 300 of FIG. 3.

Operation 210 causes the first trace and the second trace to be displayed (e.g., to a user) in a graphical user interface with a set of highlights, where each highlight in the set of highlights indicates at least one of a similarity or a difference between the first trace and the second trace. In this way, the set of highlights can highlight one or more similarities or differences between the first and the second traces. For some embodiments, a first graphical representation of one or more parameter values of the first trace are displayed (e.g., simultaneously) in the graphical user interface with a second graphical representation of one or more parameter values of the second trace (e.g., the latest version of the second trace as determined by operation 208). For example, the first and the second graphical representations can be displayed side-by-side in the graphical user interface. For various embodiments, the set of highlights are displayed with the first and the second traces such that a user viewing the graphical user interface can easily focus on relevant activity (e.g., relevant parameter values) that can assist the user with determining one or more helper assertions for proving the assertion via the second trace. In other words, the set of highlights can be configured to bring the user's attention to the relevant activity, and can help the user better understand which one or more parameter values (e.g., signal values) are causing the second trace causing the assertion to be upheld or violated. Based on one or more of the displayed highlights, a user can focus or zoom in on relevant activity shown and make a helper assertion determination. For instance, a user can see an inversion behavior of relevant activity displayed and can assist the user in creating a helper assertion that corrects the relationship with the state machine of the circuit design.

To determine the set of highlights to be displayed, operation 210 can comprise determining a first set of relevant values in the first trace, and determining a second set of relevant values in a latest version of the second trace (e.g., determined by operation 208). Thereafter, operation 210 can compare the second set of relevant values to one or more corresponding values in the first set of relevant values, and can determine the set of highlights based on the comparison of the second set of relevant values to the one or more corresponding. An example of operation 210 is illustrated and described with respect to method 400 of FIG. 4.

Figure 5:
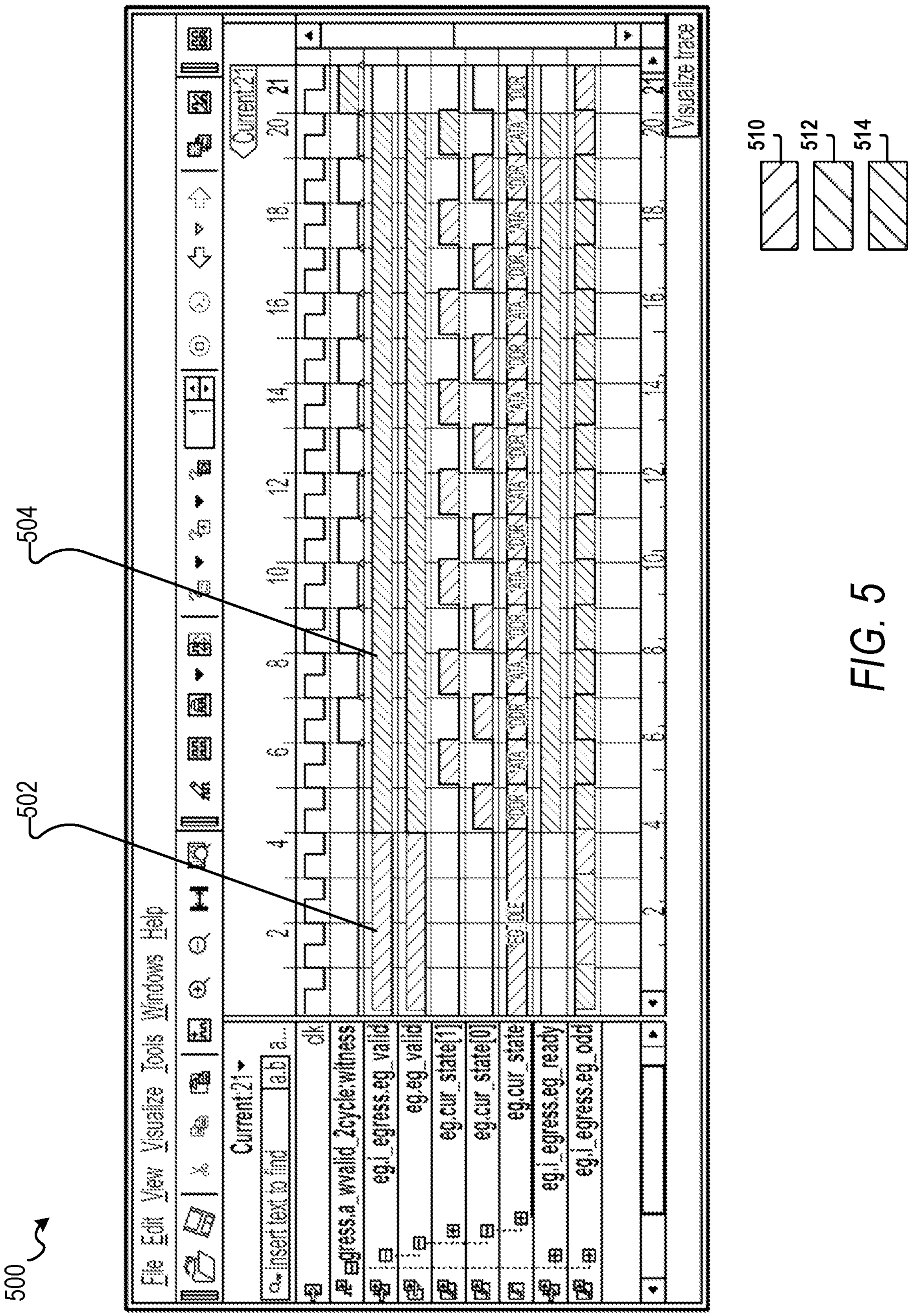
FIGS. 5 and 6 illustrate graphical user interfaces displaying example traces with highlights, according to some embodiments.
Figure 6:
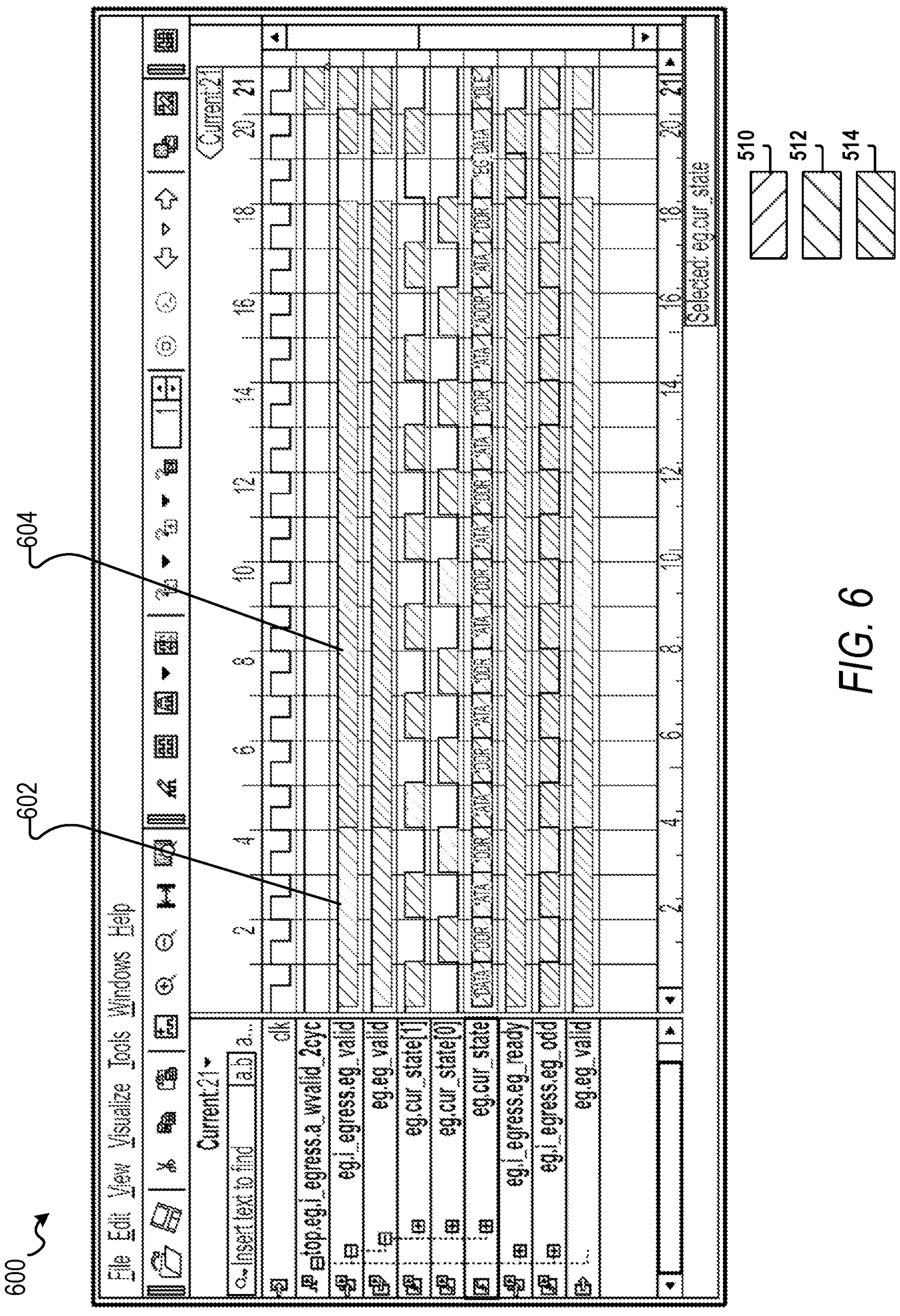

An example of a first trace (e.g., witness trace) being displayed with highlights is illustrated and described with respect to FIG. 5, and an example of a second trace (e.g., original trace) being displayed with highlights is illustrated and described with respect to FIG. 6. Examples of the first and the second traces being displayed simultaneously side-by-side are illustrated and described with respect to FIGS. 7 through 9.

To highlight similarities and differences, for some embodiments, a first type of highlight is used for any highlight of the set of highlights that indicates that corresponding values are the same in the first trace and the second trace, while a second type of highlight is used for any highlight of the set of highlights that indicates that corresponding values are different in the first trace and the second trace. Additionally, an embodiment can use different highlight types for illustrating differences in the first and the second traces. For instance, a first type of highlight (e.g., dark green) can be used for any highlight of the set of highlights that indicates that corresponding values are the same in the first trace and the second trace, a second type of highlight (e.g., light green) can be used for any highlight of the set of highlights that is shown with respect to the first trace (e.g., witness trace) and that indicates that corresponding values are different in the first trace and the second trace, and a third type of highlight (e.g., red) can be used for any highlight of the set of highlights that is shown with respect to the second trace (e.g., original trace) and that indicates that corresponding values are different in the first trace and the second trace. A given highlight type can determine a highlight color, a highlight pattern, a highlight opacity, and the like. As described herein, other visuals can be used in place of highlights to indicate similarities and differences in parameter values between the first and the second traces.

Referring now to FIG. 3, the method 300 illustrates an example of an iterative process for adjusting and regenerating a second trace (e.g., witness trace) to cause (e.g., force) the second trace to become more similar (e.g., as similar as possible, or maximally similar) to a first trace (e.g., an original trace). For some embodiments, the method 300 represents an example implementation of operation 208 of the method 200 of FIG. 2.

Operation 302 determines a set of relevant values in a latest version of the second trace. In doing so, operation 302 can extract relevant activity from the latest (e.g., last) version of the second trace generated (e.g., either by operation 206 or by a prior iteration of the method 300). Then, operation 304 compares the set of relevant values to a set of corresponding values in the first trace.

At operation 306, the second trace is adjusted by adding a set of constraints for the second trace based on the comparing of the set of relevant values and the set of corresponding values. To add the set of constraints for the second trace, operation 306 can determines whether a relevant value from the set of relevant values agrees with a corresponding value from the set of corresponding values. In response to determining that the relevant value agrees with the corresponding value, operation 306 adds a constraint for the second trace that maintains agreement between the relevant value and the corresponding value. Alternatively, in response to determining that the relevant value disagrees with the corresponding value, operation 306 can add a constraint for the second trace that causes agreement between the relevant value and the corresponding value (e.g., causes the disagreement to be converted to an agreement).

Subsequently, operation 308 regenerates a new version of the second trace after the set of constraints are added for the second trace (e.g., set of constraints added for generating the second trace). In doing so, operation 308 can attempt to reprove that the assertion always holds true for circuit design starting from a non-reset state of the circuit design. Then operation 310 determines whether a change exists between the latest version of the second trace and the new version of the second trace. In response to operation 310 determining that a change exists, the method 300 returns to operation 302 so that another iteration of the method 300 can be performed with the new version of the second trace being used as the latest version of the second trace. Alternatively, in response to operation 310 determining that a change does not exist, the method 300 continues to operation 308, where the latest version of the second trace is provided for further processing (e.g., for display to a user through a graphical user interface [GUI]) and the method 300 ends.

Referring now to FIG. 4, the method 400 illustrates an example of operation 210, which causes a first trace and a second trace to be displayed with a set of highlights after operation 208. Operation 402 determines a first set of relevant values in the first trace. In doing so, operation 402 can extract relevant activity from the first trace. For some embodiments, the first set of relevant values can comprise a list of values in triplet form, where the triplet form can be defined as (single, cycle number, signal value). Operation 404 determines a second set of relevant values in a latest version of the second trace. In doing so, operation 404 can extract relevant activity from the latest version of the second trace. For some embodiments, the second set of relevant values can comprise a list of values in triplet form, where the triplet form can be defined as (single, cycle number, signal value). Additionally, for some embodiments, the cycle numbers in the lists of values can be counted back backward from the end of a trace.

During operation 406, the second set of relevant values (e.g., relevant signal values) is compared to one or more corresponding values in the first set of relevant values. Thereafter, operation 408 determines the set of highlights based on the comparing of the second set of relevant values to the one or more corresponding values.

FIGS. 5 and 6 illustrate graphical user interfaces 500, 600 displaying example traces with highlights, according to some embodiments. In FIG. 5, a graphical user interface 500 displays several signal values (e.g., eg.i_egress.eg_valid, eg.eg_valid, eg.cur_stat(1), eg.cur_stat(0), eg.cur_state, etc.) from a trace with highlight 502 of a first highlight type (510) and highlight 504 of a second highlight type (514). The example trace can represent a first trace (e.g., witness trace), where highlight 504 highlights a portion of the eg.i_egress.eg_valid signal that is similar (e.g., matches in value) with a corresponding portion of the eg.i_egress.eg_valid signal in a second trace (e.g., original trace), and where highlight 502 highlights another portion of the eg.i_egress.eg_valid signal that is not similar (e.g., mismatches in value) with a corresponding portion of the eg.i_egress.eg_valid signal in the second trace.

In FIG. 6, a graphical user interface 600 also displays several signal values (e.g., eg.i_egress.eg_valid, eg.eg_valid, eg.cur_stat(1), eg.cur_stat(0), eg.cur_state, etc.) from another trace with highlight 602 of a third highlight type (512) and highlight 604 of the second highlight type (514). The example trace can represent a second trace (e.g., original trace), where highlight 604 highlights the portion of the eg.i_egress.eg_valid signal that is similar (e.g., matches in value) with the corresponding portion of the eg.i_egress.eg_valid signal in the first trace (e.g., witness trace), and where highlight 602 highlights the portion of the eg.i_egress.eg_valid signal that is not similar (e.g., mismatches in value) with the corresponding portion of the eg.i_egress.eg_valid signal in the first trace.

For some embodiments, those portions of signal values in the second trace of FIG. 6 highlighted with the third highlight type 512 can illustrate a relevant value of the second trace that causes the design property of the assertion to fail. Additionally, for various embodiments, those portions of signal values in the first trace of FIG. 5 highlighted with the first highlight type 510 can illustrate a relevant value of the first trace (e.g., witness trace) that can help the cover pass, and could assist (e.g., a user) in determining (e.g., generating) one or more helper assertions that assist the second trace (e.g., the original trace) in passing the assertion.

Figure 7:
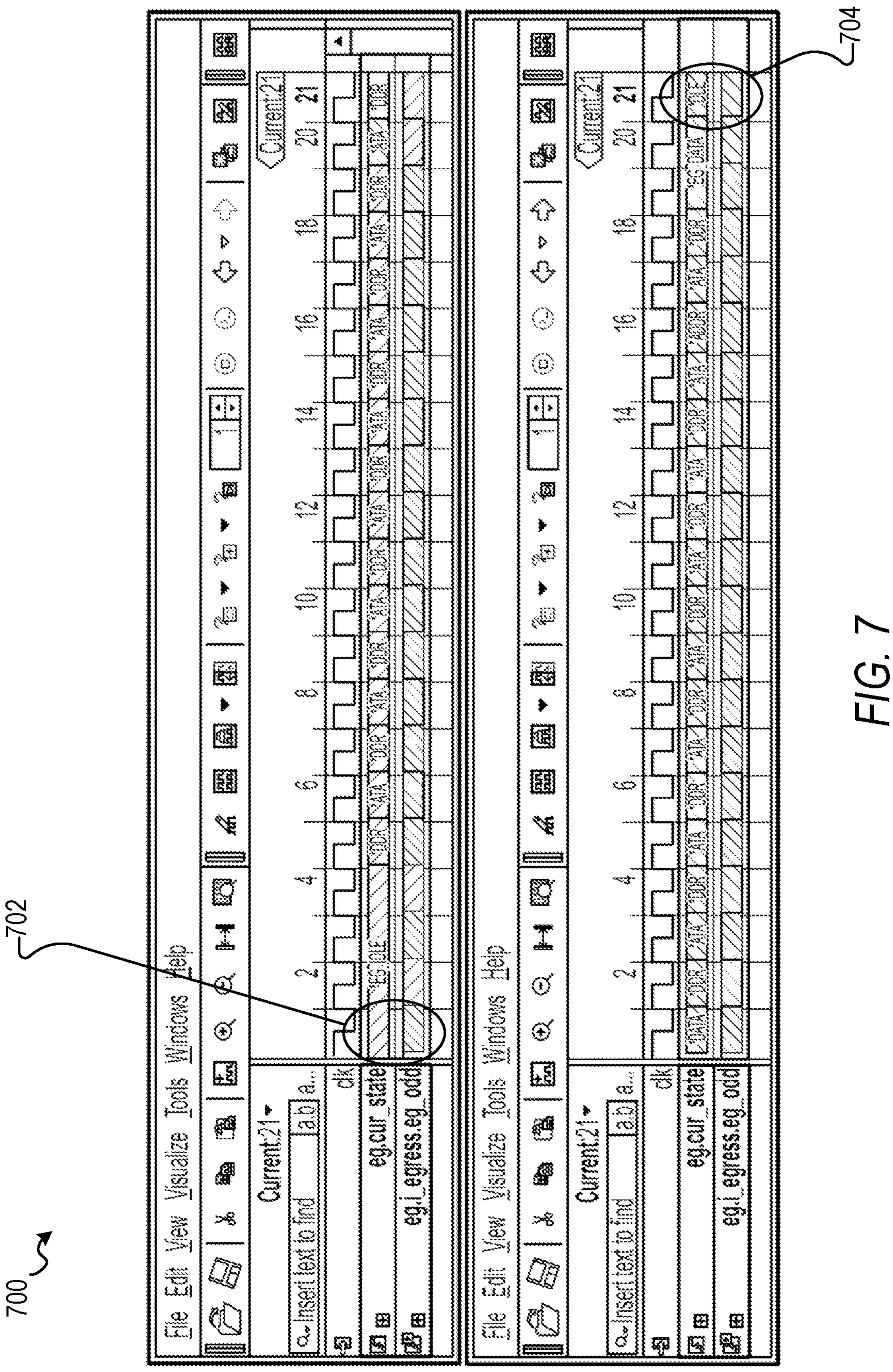
FIGS. 7 through 9 illustrate graphical user interfaces displaying example traces simultaneously side-by-side, according to some embodiments.
Figure 8:
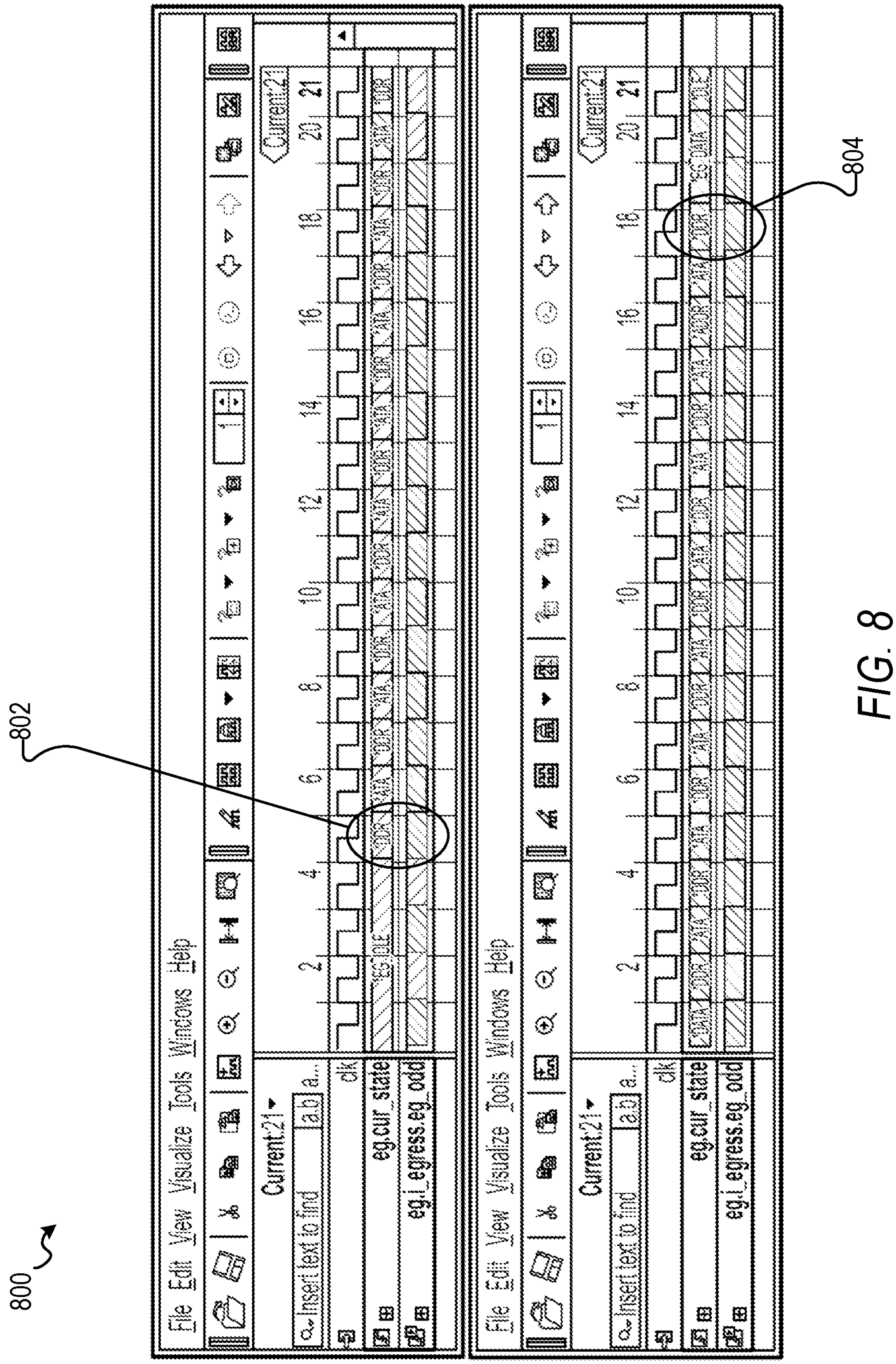
Figure 9:
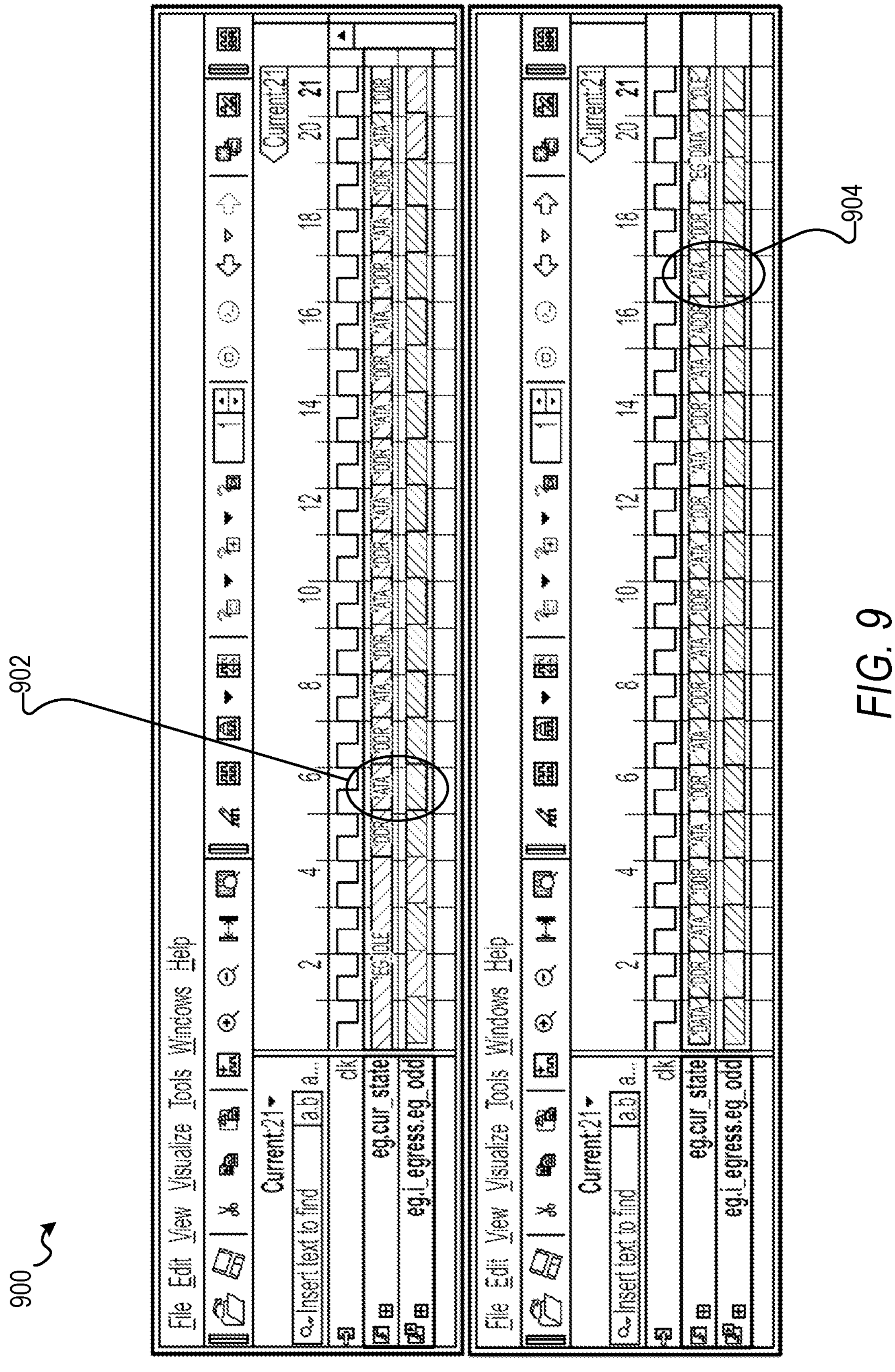

FIGS. 7 through 9 illustrate graphical user interfaces 700, 800, 900 displaying example traces simultaneously side-by-side, according to some embodiments. In particular, FIGS. 7 through 9 illustrate examples of what can be displayed to a user when they focus/zoom in on relevant activity in the traces to determine one or more helper assertions. Each of FIGS. 7 through 9 illustrates a first trace (e.g., witness trace) and a second trace (e.g., original trace) that includes signal values eg.cur_state and eg.i_egress.eg_odd. Based on the highlights of portions 702 and 704 of FIG. 7, the highlights of portions 802 and 804 of FIG. 8, the highlights of portions 902 and 904 of FIG. 9, a user can observe the inversion behavior shown, and can create a helper assertion so that signal eg.i_egress.eg_odd can have a correct relationship with the state machine represented by signal eg.cur_state. Specifically, FIG. 7 illustrates the behavior of (eg.cur_state=‘EG_IDLE) && (eg.i_egress.eg_odd==1'b1), FIG. 8 illustrates the behavior of (eg.cur_state==‘EG_ADDR) && (eg.i_egress.eg_odd==1'b1), and FIG. 9 illustrates the behavior of (eg.cur_state==‘EG_DATA) && (eg.i_egress.eg_odd==1'b0). Based on observing this behavior, a user can determine (e.g., identify or generate) the following helper assertions {((eg.cur_state==‘EG_ADDR) && eg.i_egress.eg_odd)||((eg.cur_state==‘EG_DATA) && !eg.i_egress.eg_odd)||((eg.cur_state==‘EG_IDLE) && eg.i_egress.eg_odd)}.

Figure 10:
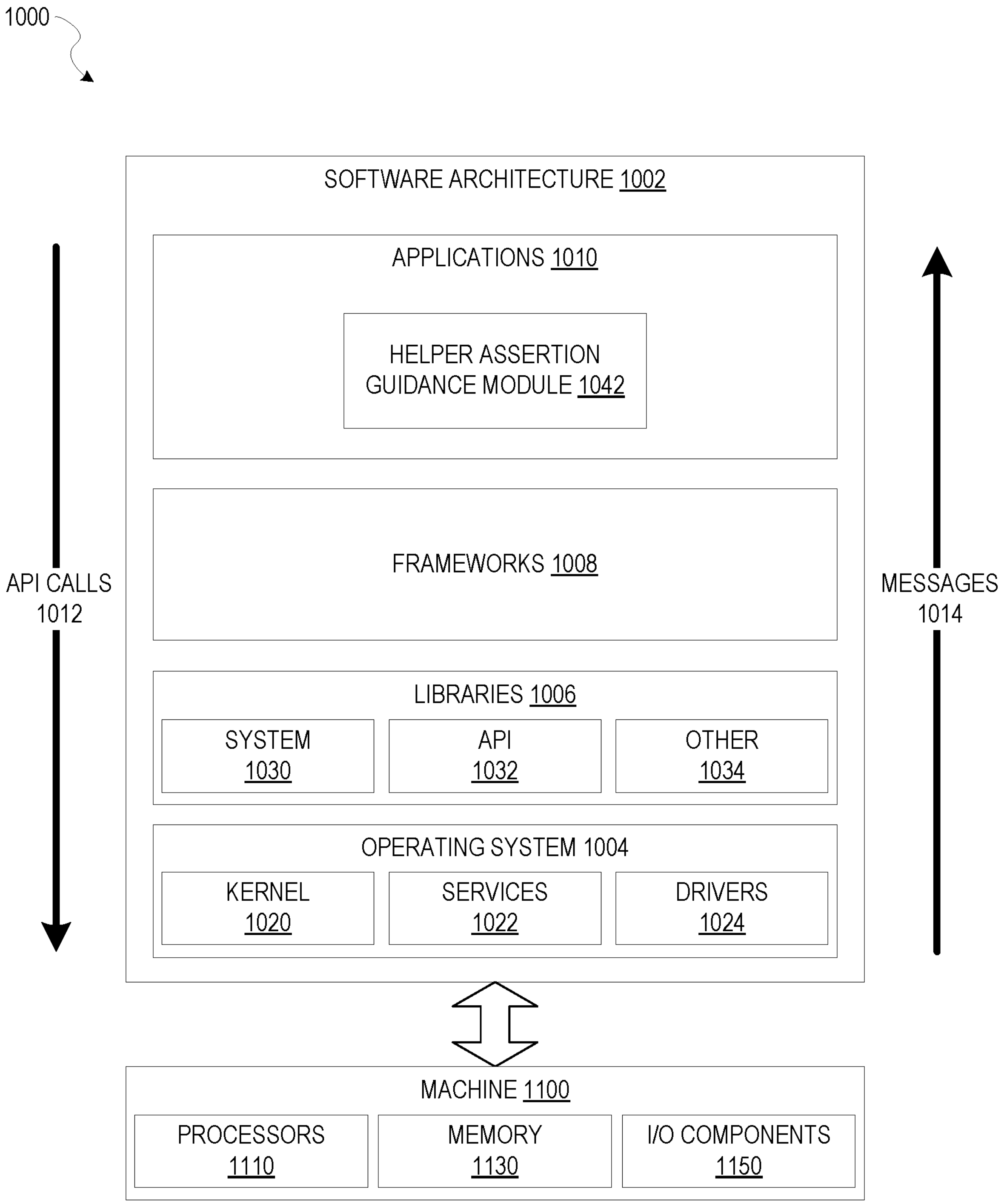
FIG. 10 is a block diagram illustrating an example of a software architecture that may be operating on an EDA computing device and may be used with methods for determining guidance that assists in determining one or more helper assertions for circuit design verification, according to some embodiments.

FIG. 10 is a block diagram 1000 illustrating an example of a software architecture 1002 that may be operating on an EDA computer and may be used with methods for determining helper assertion guidance for circuit design verification, according to some embodiments. The software architecture 1002 can be used as an EDA computing device to implement any of the methods described above. Aspects of the software architecture 1002 may, in various embodiments, be used to store circuit designs, and to facilitate generation of a circuit design in an EDA environment by determining helper assertion guidance for circuit design verification.

FIG. 10 is merely a non-limiting example of a software architecture 1002, and it will be appreciated that many other architectures can be implemented to facilitate the functionality described herein. In various embodiments, the software architecture 1002 is implemented by hardware such as a machine 1100 of FIG. 11 that includes processors 1110 (e.g., hardware processors), memory 1130, and input/output (I/O) components 1150. In this example, the software architecture 1002 can be conceptualized as a stack of layers where each layer may provide a particular functionality. For example, the software architecture 1002 includes layers such as an operating system 1004, libraries 1006, software frameworks 1008, and applications 1010. Operationally, the applications 1010 invoke application programming interface (API) calls 1012 through the software stack and receive messages 1014 in response to the API calls 1012, consistent with some embodiments. In various embodiments, any client device, any server computer of a server system, or any other device described herein may operate using elements of the software architecture 1002. An EDA computing device described herein may additionally be implemented using aspects of the software architecture 1002, with the software architecture 1002 adapted for determining helper assertion guidance for circuit design verification in any manner described herein.

In some embodiments, an EDA application of the applications 1010 determines helper assertion guidance for circuit design verification according to embodiments described herein using various modules within the software architecture 1002. For example, in some embodiments, an EDA computing device similar to the machine 1100 includes the memory 1130 and the one or more processors 1110. The processors 1110 also implement helper assertion guidance module 1042 for determining helper assertion guidance for circuit design verification, in accordance with various embodiments described herein.

In various other embodiments, rather than being implemented as modules of the one or more applications 1010, the helper assertion guidance module 1042 may be implemented using elements of the libraries 1006, the operating system 1004, or the software frameworks 1008.

In various implementations, the operating system 1004 manages hardware resources and provides common services. The operating system 1004 includes, for example, a kernel 1020, services 1022, and drivers 1024. The kernel 1020 acts as an abstraction layer between the hardware and the other software layers, consistent with some embodiments. For example, the kernel 1020 provides memory management, processor management (e.g., scheduling), component management, networking, and security settings, among other functionalities. The services 1022 can provide other common services for the other software layers. The drivers 1024 are responsible for controlling or interfacing with the underlying hardware, according to some embodiments. For instance, the drivers 1024 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 1006 provide a low-level common infrastructure utilized by the applications 1010. The libraries 1006 can include system libraries 1030 such as libraries of blocks for use in an EDA environment or other libraries that can provide functions such as memory allocation functions, string manipulation functions, mathematic functions, and the like. In addition, the libraries 1006 can include API libraries 1032 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in 2D and 3D in a graphic context on a display), database libraries (e.g., SQLite to provide various relational database functions), web libraries (e.g., WebKit to provide web browsing functionality), and the like. The libraries 1006 may also include other libraries 1034.

The software frameworks 1008 provide a high-level common infrastructure that can be utilized by the applications 1010, according to some embodiments. For example, the software frameworks 1008 provide various graphic user interface (GUI) functions, high-level resource management, high-level location services, and so forth. The software frameworks 1008 can provide a broad spectrum of other APIs that can be utilized by the applications 1010, some of which may be specific to a particular operating system 1004 or platform. In various embodiments, the systems, methods, devices, and instructions described herein may use various files, macros, libraries, and other elements of an EDA design environment to implement determining helper assertion guidance for circuit design verification as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 1002, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose hardware processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 1100 including processors 1110), with these operations being accessible via a network (e.g., the Internet) and via one or more appropriate interfaces (e.g., an API). In certain embodiments, for example, a client device may relay or operate in communication with cloud computing systems and may access circuit design information in a cloud environment.

The performance of certain of the operations may be distributed among the processors, not only residing within a single machine 1100, but deployed across a number of machines 1100. In some embodiments, the processors 1110 or processor-implemented modules are located in a single geographic location (e.g., within a home environment, an office environment, or a server farm). In some other embodiments, the processors or processor-implemented modules are distributed across a number of geographic locations.

Figure 11:
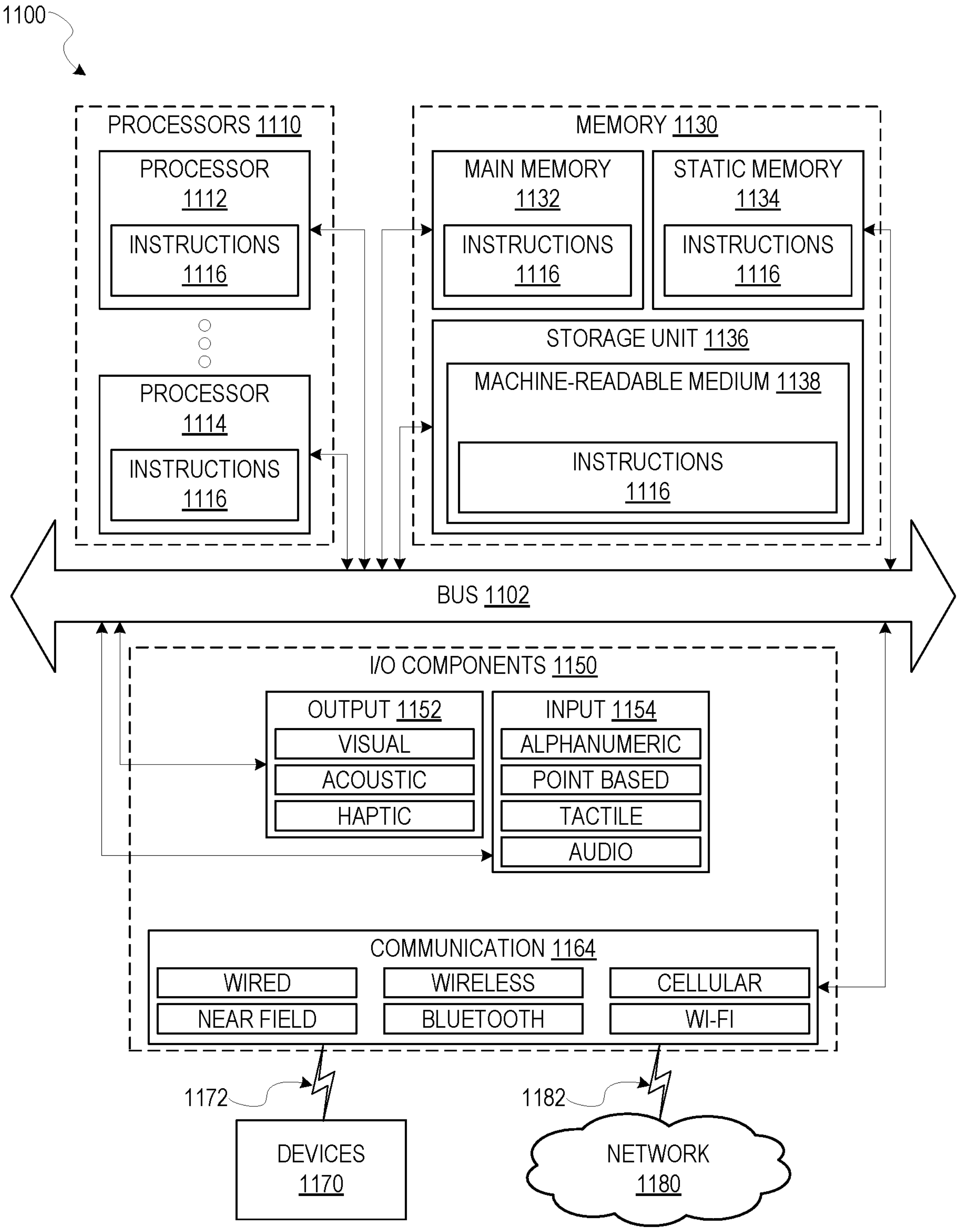
FIG. 11 is a diagram representing a machine in the form of a computer system within which a set of instructions are executed, causing the machine to perform any one or more of the methods discussed herein, according to some embodiments.

FIG. 11 is a diagrammatic representation of the machine 1100 in the form of a computer system within which a set of instructions may be executed for causing the machine 1100 to perform any one or more of the methodologies discussed herein, according to some embodiments. FIG. 11 shows components of the machine 1100, which is, according to some embodiments, able to read instructions from a machine-readable medium (e.g., a machine-readable storage medium) and perform any one or more of the methodologies discussed herein. Specifically, FIG. 11 shows a diagrammatic representation of the machine 1100 in the example form of a computer system, within which instructions 1116 (e.g., software, a program, an application, an applet, an app, or other executable code) for causing the machine 1100 to perform any one or more of the methodologies discussed herein can be executed. In alternative embodiments, the machine 1100 operates as a standalone device or can be coupled (e.g., networked) to other machines. In a networked deployment, the machine 1100 may operate in the capacity of a server machine or a client machine in a server-client network environment, or as a peer machine in a peer-to-peer (or distributed) network environment. The machine 1100 can comprise, but not be limited to, a server computer, a client computer, a personal computer (PC), a tablet computer, a laptop computer, a netbook, or any machine capable of executing the instructions 1116, sequentially or otherwise, that specify actions to be taken by the machine 1100. Further, while only a single machine 1100 is illustrated, the term "machine" shall also be taken to include a collection of machines 1100 that individually or jointly execute the instructions 1116 to perform any one or more of the methodologies discussed herein.

In various embodiments, the machine 1100 comprises processors 1110, memory 1130, and I/O components 1150, which can be configured to communicate with each other via a bus 1102. In some embodiments, the processors 1110 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another, or any suitable combination thereof) include, for example, a processor 1112 and a processor 1114 that may execute the instructions 1116. The term "processor" is intended to include multi-core processors 1110 that may comprise two or more independent processors 1112, 1114 (also referred to as "cores") that can execute the instructions 1116 contemporaneously. Although FIG. 11 shows multiple processors 1110, the machine 1100 may include a single processor 1112 with a single core, a single processor 1112 with multiple cores (e.g., a multi-core processor 1112), multiple processors 1110 with a single core, multiple processors 1110 with multiple cores, or any combination thereof.

The memory 1130 comprises a main memory 1132, a static memory 1134, and a storage unit 1136 accessible to the processors 1110 via the bus 1102, according to some embodiments. The storage unit 1136 can include a machine-readable medium 1138 on which are stored the instructions 1116 embodying any one or more of the methodologies or functions described herein. The instructions 1116 can also reside, completely or at least partially, within the main memory 1132, within the static memory 1134, within at least one of the processors 1110 (e.g., within the processor's cache memory), or any suitable combination thereof, during execution thereof by the machine 1100. Accordingly, in various embodiments, the main memory 1132, the static memory 1134, and the processors 1110 are considered machine-readable media 1138.

As used herein, the term "memory" refers to a machine-readable medium 1138 able to store data temporarily or permanently and may be taken to include, but not be limited to, random-access memory (RAM), read-only memory (ROM), buffer memory, flash memory, and cache memory. While the machine-readable medium 1138 is shown, in some embodiments, to be a single medium, the term "machine-readable medium" should be taken to include a single medium or multiple media (e.g., a centralized or distributed database, or associated caches and servers) able to store the instructions 1116. The term "machine-readable medium" shall also be taken to include any medium, or combination of multiple media, that is capable of storing instructions (e.g., the instructions 1116) for execution by a machine (e.g., the machine 1100), such that the instructions, when executed by one or more processors of the machine (e.g., the processors 1110), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1150 include a wide variety of components to receive input, provide output, produce output, transmit information, exchange information, capture measurements, and so on. In general, it will be appreciated that the I/O components 1150 can include many other components that are not shown in FIG. 11. The I/O components 1150 are grouped according to functionality merely for simplifying the following discussion, and the grouping is in no way limiting. In various embodiments, the I/O components 1150 include output components 1152 and input components 1154. The output components 1152 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1154 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 1150 may include communication components 1164 operable to couple the machine 1100 to a network 1180 or devices 1170 via a coupling 1182 and a coupling 1172, respectively. For example, the communication components 1164 include a network interface component or another suitable device to interface with the network 1180. In further examples, the communication components 1164 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1170 may be another machine or any of a wide variety of peripheral devices (e.g., a peripheral device coupled via a USB).

In various embodiments, one or more portions of the network 1180 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1180 or a portion of the network 1180 may include a wireless or cellular network, and the coupling 1182 may be a Code Division Multiple Access (CDMA) connection, a Global System for Mobile communications (GSM) connection, or another type of cellular or wireless coupling.

Furthermore, the machine-readable medium 1138 is non-transitory (in other words, not having any transitory signals) in that it does not embody a propagating signal. However, labeling the machine-readable medium 1138 "non-transitory" should not be construed to mean that the machine-readable medium 1138 is incapable of movement; the machine-readable medium 1138 should be considered as being transportable from one physical location to another. Additionally, since the machine-readable medium 1138 is tangible, the machine-readable medium 1138 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A system for determining guidance that assists in determining one or more helper assertions for circuit design verification, the system comprising:
- a memory storing instructions; and
- a hardware processor communicatively coupled to the memory and configured by the instructions to perform operations comprising:
  - accessing a cover for an assertion of a circuit design, the assertion describing a design property of the circuit design, the cover being configured to show that the assertion holds true at least once for the circuit design;
  - generating a first trace that proves the cover for the circuit design starting from a reset state of the circuit design;
  - generating a second trace to prove that the assertion always holds true for circuit design starting from a non-reset state of the circuit design;
  - regenerating the second trace, the regenerating comprising causing one or more relevant values of the second trace to become similar to one or more relevant values of the first trace based on a similarity condition by iteratively adjusting and regenerating the one or more relevant values of the second trace; and
  - causing the first trace and the regenerated second trace to be displayed in a graphical user interface with a set of highlights, each highlight in the set of highlights indicating at least one of a similarity or a difference between the first trace and the regenerated second trace, the set of highlights being used as guidance for determining the one or more helper assertions.

2. The system of claim 1, wherein the iteratively adjusting and regenerating the one or more relevant values of the second trace comprises:
- performing a process iteration comprising:
  - determining a set of relevant values in a latest version of the second trace;
  - comparing the set of relevant values to a set of corresponding values in the first trace;
  - adjusting the second trace by adding a set of constraints for the second trace based on the comparing of the set of relevant values and the set of corresponding values;
  - regenerating a new version of the second trace after the set of constraints are added for the second trace;
  - determining whether a change exists between the latest version of the second trace and the new version of the second trace; and
  - in response to determining that the change exists, re-performing the process iteration with the new version of the second trace as the latest version of the second trace.

3. The system of claim 2, wherein the process iteration ends after a certain number of process iterations have been performed.

4. The system of claim 2, wherein the process iteration ends after a certain amount of time has elapsed.

5. The system of claim 2, wherein the adding of the set of constraints for the second trace based on the comparing of the set of relevant values and the set of corresponding values comprises:
- determining whether a relevant value from the set of relevant values agrees with a corresponding value from the set of corresponding values; and
- in response to determining that the relevant value agrees with the corresponding value, adding a constraint for the second trace that maintains agreement between the relevant value and the corresponding value.

6. The system of claim 2, wherein the adding of the set of constraints for the second trace based on the comparing of the set of relevant values and the set of corresponding values comprises:
- determining whether a relevant value from the set of relevant values agrees with a corresponding value from the set of corresponding values; and
- in response to determining that the relevant value disagrees with the corresponding value, adding a constraint for the second trace that causes agreement between the relevant value and the corresponding value.

7. The system of claim 1, wherein the iteratively adjusting and regenerating the one or more relevant values of the second trace comprises:
- performing a process iteration comprising:
  - determining a set of relevant values in a latest version of the second trace;
  - comparing the set of relevant values to a set of corresponding values in the first trace;
  - adjusting the second trace by adding a set of constraints for the second trace based on the comparing of the set of relevant values and the set of corresponding values;
  - regenerating a new version of the second trace after the set of constraints are added for the second trace;
  - determining whether a change exists between the latest version of the second trace and the new version of the second trace; and
  - in response to determining that the change does not exist, ending the process iteration and providing the latest version of the second trace for display.

8. The system of claim 1, wherein the operations comprise:
- prior to accessing the cover, generating the cover based on at least one condition for the circuit design recited by the assertion.

9. The system of claim 1, wherein a first type of highlight is used for any highlight of the set of highlights that indicates that corresponding values are the same in the first trace and the second trace, and a second type of highlight is used for any highlight of the set of highlights that indicates that corresponding values are different in the first trace and the second trace.

10. The system of claim 1, wherein a first type of highlight is used for any highlight of the set of highlights that indicates that corresponding values are the same in the first trace and the second trace, a second type of highlight is used for any highlight of the set of highlights that is shown with respect to the first trace and that indicates that corresponding values are different in the first trace and the second trace, and a third type of highlight is used for any highlight of the set of highlights that is shown with respect to the second trace and that indicates that corresponding values are different in the first trace and the second trace.

11. The system of claim 1, wherein the causing of the first trace and the second trace to be displayed in the graphical user interface with the set of highlights comprises:

determining a first set of relevant values in the first trace;

determining a second set of relevant values in a latest version of the second trace;

comparing the second set of relevant values to one or more corresponding values in the first set of relevant values; and determining the set of highlights based on the comparing of the second set of relevant values to the one or more corresponding values.

12. A non-transitory computer-readable medium comprising instructions that, when executed by a hardware processor of a device, cause the device to perform operations for determining guidance that assists in determining one or more helper assertions for circuit design verification, the operations comprising:

accessing a cover for an assertion of a circuit design, the assertion describing a design property of the circuit design, the cover being configured to show that the assertion holds true at least once for the circuit design;

generating a first trace that proves the cover for the circuit design starting from a reset state of the circuit design;

generating a second trace to prove that the assertion always holds true for circuit design starting from a non-reset state of the circuit design;

regenerating the second trace, the regenerating comprising causing one or more relevant values of the second trace to become similar to one or more relevant values of the first trace based on a similarity condition by iteratively adjusting and regenerating the one or more relevant values of the second trace; and causing the first trace and the regenerated second trace to be displayed in a graphical user interface with a set of highlights, each highlight in the set of highlights indicating at least one of a similarity or a difference between the first trace and the regenerated second trace, the set of highlights being used as guidance for determining the one or more helper assertions.

13. The non-transitory computer-readable medium of claim 12, wherein the iteratively adjusting and regenerating the one or more relevant values of the second trace comprises:

performing a process iteration comprising:

determining a set of relevant values in a latest version of the second trace;

comparing the set of relevant values to a set of corresponding values in the first trace;

adjusting the second trace by adding a set of constraints for the second trace based on the comparing of the set of relevant values and the set of corresponding values;

regenerating a new version of the second trace after the set of constraints are added for the second trace;

determining whether a change exists between the latest version of the second trace and the new version of the second trace; and in response to the determining that the change exists, re-performing the process iteration with the new version of the second trace as the latest version of the second trace.

14. The non-transitory computer-readable medium of claim 13, wherein the process iteration ends after a certain number of process iterations have been performed.

15. The non-transitory computer-readable medium of claim 13, wherein the process iteration ends after a certain amount of time has elapsed.

16. The non-transitory computer-readable medium of claim 13, wherein the adding of the set of constraints for the second trace based on the comparing of the set of relevant values and the set of corresponding values comprises:

determining whether a relevant value from the set of relevant values agrees with a corresponding value from the set of corresponding values; and in response to determining that the relevant value agrees with the corresponding value, adding a constraint for the second trace that maintains agreement between the relevant value and the corresponding value.

17. The non-transitory computer-readable medium of claim 13, wherein the adding of the set of constraints for the second trace based on the comparing of the set of relevant values and the set of corresponding values comprises:

determining whether a relevant value from the set of relevant values agrees with a corresponding value from the set of corresponding values; and in response to determining that the relevant value disagrees with the corresponding value, adding a constraint for the second trace that causes agreement between the relevant value and the corresponding value.

18. The non-transitory computer-readable medium of claim 12, wherein the iteratively adjusting and regenerating the one or more relevant values of the second trace comprises:

performing a process iteration comprising:

determining a set of relevant values in a latest version of the second trace;

comparing the set of relevant values to a set of corresponding values in the first trace;

adjusting the second trace by adding a set of constraints for the second trace based on the comparing of the set of relevant values and the set of corresponding values;

regenerating a new version of the second trace after the set of constraints are added for the second trace;

determining whether a change exists between the latest version of the second trace and the new version of the second trace; and in response to the determining that the change does not exist, ending the process iteration and providing the latest version of the second trace for display.

19. The non-transitory computer-readable medium of claim 12, wherein the causing of the first trace and the second trace to be displayed in the graphical user interface with a set of highlights comprises:

determining a first set of relevant values in the first trace;

determining a second set of relevant values in a latest version of the second trace;

comparing the second set of relevant values to one or more corresponding values in the first set of relevant values; and determining the set of highlights based on the comparing of the second set of relevant values to the one or more corresponding values.

20. A method for determining guidance that assists in determining one or more helper assertions for circuit design verification, the method comprising:

accessing, by a hardware processor, a cover for an assertion of a circuit design, the assertion describing a design property of the circuit design, the cover being configured to show that the assertion holds true at least once for the circuit design;

generating, by the hardware processor, a first trace that proves the cover for the circuit design starting from a reset state of the circuit design;

generating, by the hardware processor, a second trace to prove that the assertion always holds true for circuit design starting from a non-reset state of the circuit design;

regenerating the second trace by the hardware processor, the regenerating comprising causing one or more relevant values of the second trace to become similar to one or more relevant values of the first trace based on a similarity condition by iteratively adjusting and regenerating the one or more relevant values of the second trace; and causing, by the hardware processor, the first trace and the regenerated second trace to be displayed in a graphical user interface with a set of highlights, each highlight in the set of highlights indicating at least one of a similarity or a difference between the first trace and the regenerated second trace, the set of highlights being used as guidance for determining the one or more helper assertions.

* * * * *